US009166590B1

(12) United States Patent
Yap et al.

(10) Patent No.: US 9,166,590 B1
(45) Date of Patent: Oct. 20, 2015

(54) INTEGRATED CIRCUITS WITH IMPROVED MEMORY INTERFACE CALIBRATION CAPABILITIES

(71) Applicant: Altera Corporation, San Jose, CA (US)

(72) Inventors: Chee Wai Yap, Perai (MY); Muhamad Aidil Jazmi, Sungai Rambai (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/162,037

(22) Filed: Jan. 23, 2014

(51) Int. Cl.
*H03K 19/003* (2006.01)
*H03K 19/0175* (2006.01)

(52) U.S. Cl.
CPC .............. *H03K 19/017581* (2013.01)

(58) Field of Classification Search
None
See application file for complete search history.

(56) References Cited

U.S. PATENT DOCUMENTS

| | | | | |
|---|---|---|---|---|
| 5,245,631 | A * | 9/1993 | Pirim | 375/275 |
| 6,204,889 | B1 * | 3/2001 | Endoh et al. | 348/571 |
| 7,589,556 | B1 * | 9/2009 | Tan et al. | 326/40 |
| 8,386,759 | B1 | 2/2013 | Duwel | |
| 2007/0090935 | A1 * | 4/2007 | Miller et al. | 340/445 |
| 2007/0206776 | A1 * | 9/2007 | Patel et al. | 379/399.01 |
| 2007/0217559 | A1 * | 9/2007 | Stott et al. | 375/355 |
| 2009/0273361 | A1 * | 11/2009 | Batra et al. | 326/16 |
| 2011/0025373 | A1 * | 2/2011 | Kim et al. | 326/30 |
| 2011/0225445 | A1 | 9/2011 | Gower et al. | |
| 2011/0239063 | A1 | 9/2011 | Zerbe et al. | |
| 2011/0320130 | A1 * | 12/2011 | Valdes et al. | 702/19 |
| 2012/0110400 | A1 | 5/2012 | Manohararajah et al. | |
| 2012/0262998 | A1 | 10/2012 | Kizer et al. | |
| 2013/0044552 | A1 | 2/2013 | Best | |
| 2013/0064025 | A1 | 3/2013 | Chen et al. | |

OTHER PUBLICATIONS

Romo, J., "DDR Memories Comparison and Overview", (4 pages) [Retrieved on Jan. 23, 2014] Retrieved from the Internet:<URL:http://cache.freescale.com/files/microcontrollers/doc/support_info/BeyondBits2article17.pdf.>
Altera Corporation, "External Memory Interface Handbook", vol. 3 Reference Material, Dec. 16, 2013 (257 pages) [Retreived on Jan. 23, 2014] Retrieved on the Internet<http://www.altera.com/literature/hb/external-memory/emi_ip.pdf>.
Altera Corporation, "AN 547: Putting the MAX II CPLD in Hibernation Mode to Achieve Zero Standby Current", Jan. 2009 (8 pages) [Retrieved on Jan. 23, 2014] Retrieved on the Internet:<http://www.altera.com/literature/an/an547.pdf>.

* cited by examiner

*Primary Examiner* — Crystal L Hammond
(74) *Attorney, Agent, or Firm* — Treyz Law Group; Michael H. Lyons

(57) ABSTRACT

An integrated circuit may include memory interface circuitry that interfaces with memory. The integrated circuit may include calibration circuitry and storage circuitry. The calibration circuitry may have a first configuration in which the calibration circuitry is formed from a first set of programmable logic regions that configure the calibration circuitry to generate and store calibration data at the storage circuitry. The calibration data may include strobe signal phase settings and read enable control signal timing settings. The calibration circuitry may have a second configuration in which the calibration circuitry is formed from a second set of programmable logic regions that configure the calibration circuitry to load the calibration data from the storage circuitry and to interface with the memory based on the calibration data. The calibration circuitry may occupy fewer programmable logic regions on the integrated circuit in the second configuration than in the first configuration.

23 Claims, 10 Drawing Sheets

INTEGRATED CIRCUITS WITH IMPROVED MEMORY INTERFACE CALIBRATION CAPABILITIES

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices).

Conventional memory interface circuitry typically requires clock calibration operations to be performed at each device boot-up in order to align memory controller operations with external memory operations. For example, memory interface clock signals may be calibrated to match data signals received from the memory devices. Performing calibration operations can lead to excessive delay during device power-up. In addition, calibration circuitry may occupy a disproportionately large amount of valuable circuit area on the programmable integrated circuit.

It may therefore be desirable to provide integrated circuits with improved memory interface calibration capabilities.

SUMMARY

An integrated circuit such as a programmable integrated circuit may include memory interface circuitry that interfaces with external memory. The integrated circuit may include storage circuitry such as non-volatile memory. Portions of the integrated circuit such as programmable logic regions may be configured to serve as calibration circuitry.

The calibration circuitry may have a first configuration in which the calibration circuitry performs calibration operations. For example, in the first configuration the calibration circuitry may include calibration data generation circuitry that generates and stores calibration data at the storage circuitry. Subsequent to performing calibration operations, the calibration circuitry may have a second configuration in which the calibration circuitry does not include the calibration data generation circuitry and in which the calibration circuitry loads the calibration data from the storage circuitry and interfaces with the external memory based on the calibration data.

Multiple configuration images may be stored at the storage circuitry. The integrated circuit may retrieve a first configuration image from the storage circuitry and may load the first configuration image to configure the integrated circuit in the first configuration (e.g., to configure the calibration circuitry to generate and store the calibration data). The integrated circuit may retrieve a second configuration image from the storage circuitry and may load the second configuration image to configure the integrated circuit in the second configuration (e.g., to configure the calibration circuitry to load the calibration data and operate the memory interface based on the calibration data).

In the first configuration, the calibration circuitry may be formed from a first set of programmable logic regions on the integrated circuit. In the second configuration, the calibration circuitry may be formed from a second set of programmable logic regions. The second set may be a portion (subset) of the first set of programmable logic regions. If desired, a portion of the first set of programmable logic regions may be programmed with custom user logic in the second configuration.

The stored calibration data may include strobe signal settings and read enable control signal settings. The memory interface circuitry may include read enable control circuitry, strobe signal generation circuitry, and data capture circuitry. The read enable control circuitry may generate a read enable control signal based at least partly on the read enable control signal settings in the calibration data. The strobe signal generation circuitry may generate a strobe signal based at least partly on the strobe signal settings in the calibration data. The memory interface circuitry may synchronize the strobe signal with data received from the external memory. The data capture circuitry may capture the received data based on the strobe signal.

Further features of the present invention, its nature and various advantages will be more apparent from the accompanying drawings and the following detailed description.

DETAILED DESCRIPTION

Embodiments of the present invention relate to integrated circuits having memory controller circuitry that is calibrated for communications with memory (e.g., external memory) such as random-access memory (RAM). The integrated circuits may be digital signal processors, microprocessors, application specific integrated circuits, or other suitable integrated circuits. These types of integrated circuits that are operable to communicate with system memory can benefit from improved memory interface circuitry designs.

Figure 1:
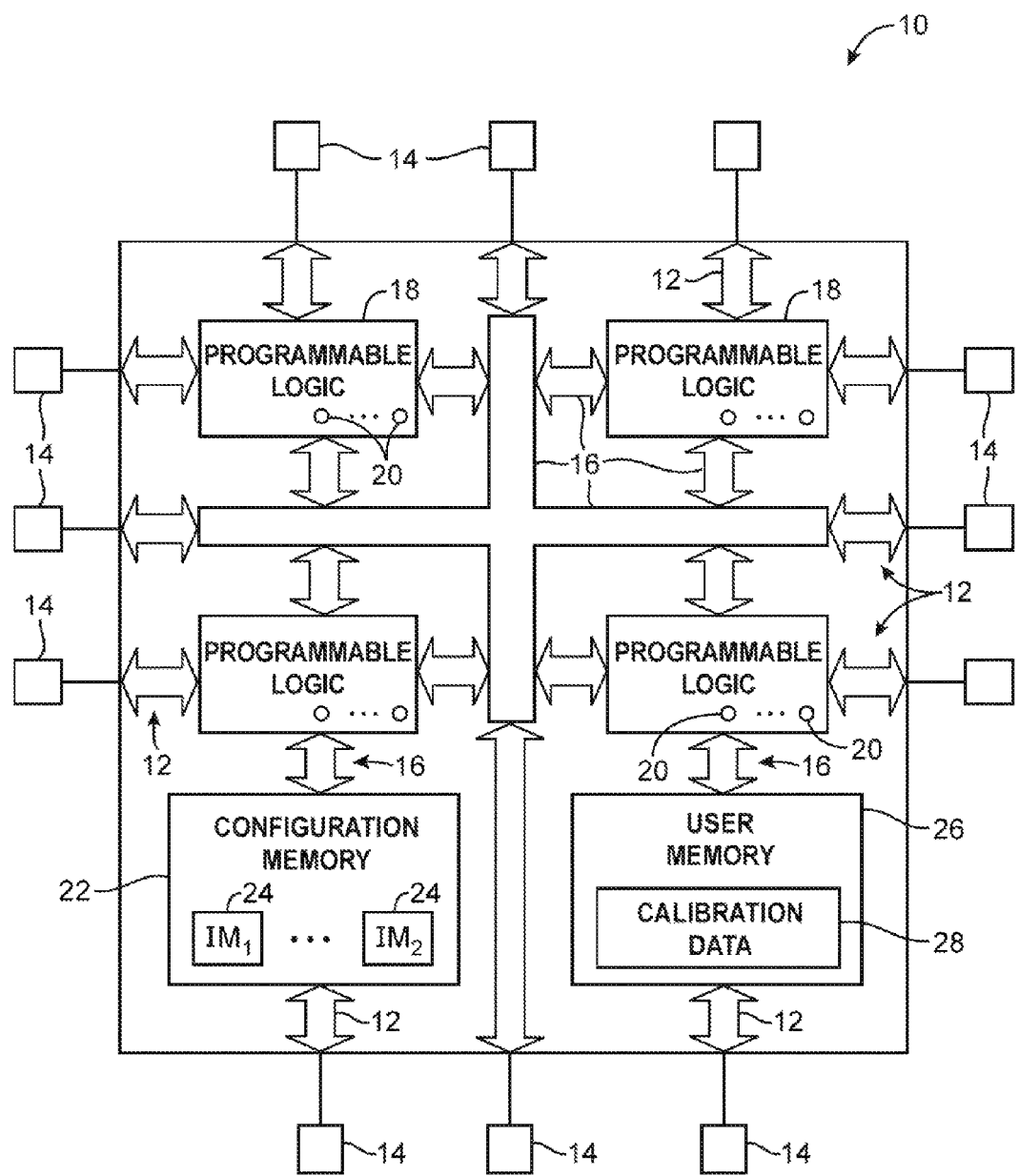
FIG. 1 is a diagram of an illustrative programmable integrated circuit device that may include memory controller circuitry and non-volatile memory in accordance with an embodiment of the present invention.

As an example, an integrated circuit such as a programmable integrated circuit may include memory controller circuitry. This is merely illustrative and does not serve to limit the scope of the present invention. If desired, application specific integrated circuits, microprocessors, and other application specific standard products may contain memory interface circuitry. FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). I/O resources 12 may include fixed interconnects and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are often applied to gates of metal-oxide-semiconductor (MOS) transistors (sometimes referred to as pass gate transistors). This example is merely illustrative. If desired, programmable elements 20 may be used to provide static output signals for configuring any desired circuitry on device 10.

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Device 10 may include non-volatile memory such as flash memory. As shown in FIG. 1, non-volatile memory on device 10 may include configuration flash memory 22 and user flash memory 26. However, this example is merely illustrative. If desired, device 10 may include configuration memory and user memory implemented using any desired non-volatile memory such as non-volatile random access memory. Interconnection resources 16 may be used to route signals between configuration memory 22, user memory 26, and other portions of device 10 such as programmable logic 18. Configuration memory 22 may store configuration data such as one or more configuration images 24 (e.g., a first configuration image $IM_1$, a second configuration image $IM_2$, etc.). Configuration data such as images 24 may be loaded onto CFM 22 using pins 14 and input-output circuitry 12. Configuration images 24 in CFM 22 may be loaded onto portions of device 10 such as programmable logic 18 during boot-up of device 10. Configuration images 24 may include configuration data that is loaded onto programmable elements of programmable logic 18 and configures programmable logic 18 to perform desired functions. If desired, device 10 may load a first configuration image 24 onto programmable logic 18 during a first boot-up and may load a second configuration image 24 onto logic 18 during subsequent boot-ups of device 10.

User memory 26 may be used to store user data during programming and operation of device 10. For example, a user may load user data onto UFM 26 using I/O circuitry 12 and pins 14. Circuitry on or external to device 10 may perform read, write, and/or erase operations on user memory 26 (e.g., through I/O circuitry 12 and pins 14, through logic 18, etc.). If desired, programmable logic 18 may perform read, write, and erase operations on user data stored in user memory 26. User memory 26 may store calibration data 28. Calibration data 28 may include device settings and other calibration information for use during operation of device 10. Calibration data 28 may be generated and stored on user memory 26 by a user (e.g., over I/O circuitry 12 and pins 14) or using circuitry implemented on logic 18. For example, calibration sequencer circuitry and other custom logic that is implemented using logic 18 may generate, read, write, modify, and/or erase calibration data 28 on user memory 26.

User memory 26 may have any desired memory capacity. For example, user memory 26 may have 48 Kbits of storage capacity, 96 Kbits of storage capacity, 784 Kbits of storage capacity, more than 784 Kbits (e.g., 912, 1472, 1920, 2176, 3584 Kbits, etc.), or any other desired amount of storage capacity. Because user memory 26 and configuration memory 22 include non-volatile memory, calibration data 28 stored on user memory 26 and configuration data such as configuration images 24 on configuration memory 22 may be retained even when device 10 is powered down.

Figure 2:
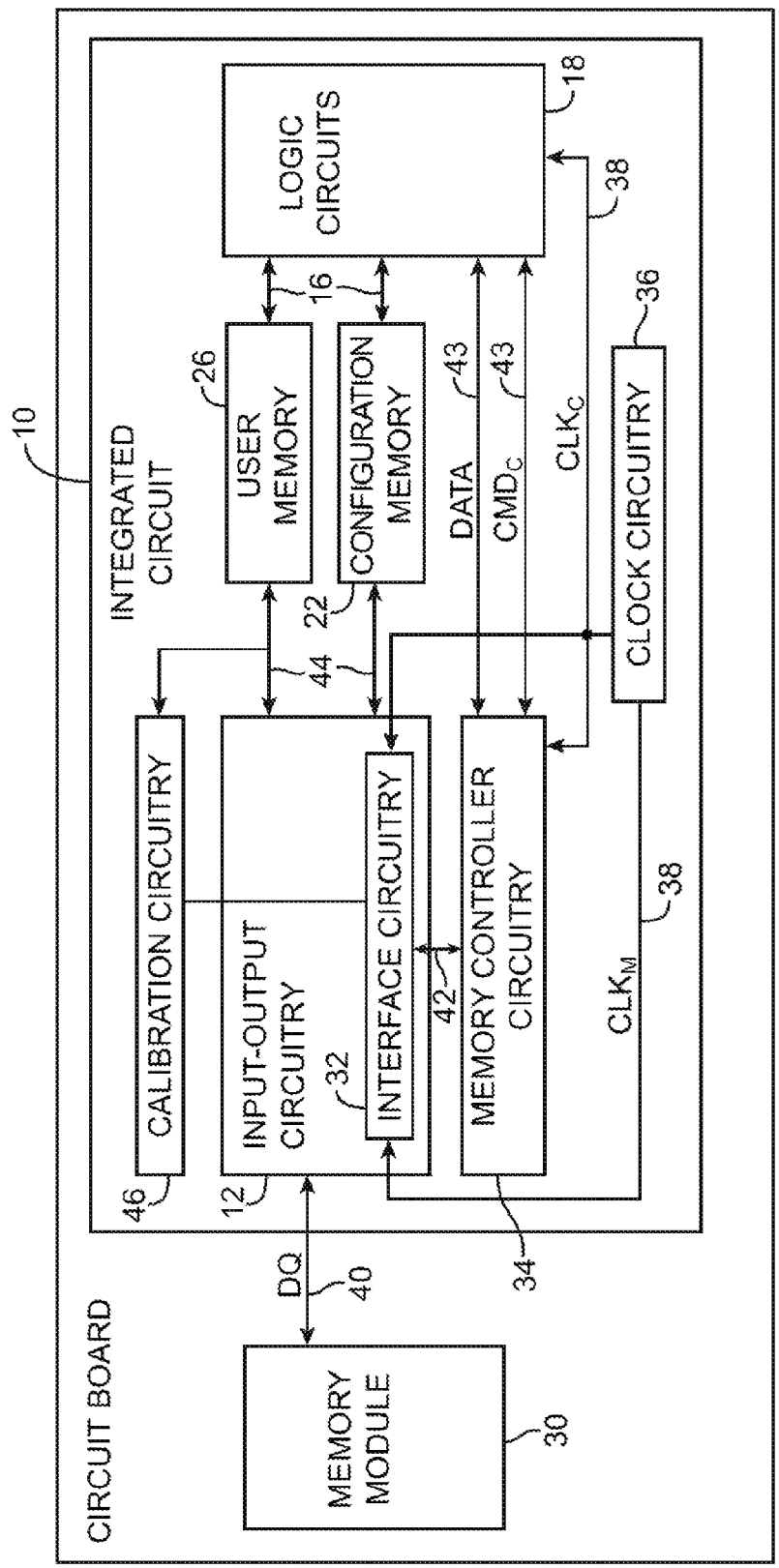
FIG. 2 is a diagram of an illustrative integrated circuit having memory controller circuitry operable to communicate with non-volatile memory and an external memory module in accordance with an embodiment of the present invention.

Device 10 may communicate with memory such as external memory module 30 as shown in FIG. 2. External memory module 30 may be a memory device such as a single in-line memory module (SIMM) or a dual in-line memory module (DIMM). Device 10 may be configured to communicate with at least two external memory modules 30, at least four external memory modules 30, etc. In the example of FIG. 2, integrated circuit 10, memory module 30, and other circuit components (e.g., integrated circuit chips, surface mount components, etc.) may be mounted on a circuit board 8. Circuit board 8 may, for example, be a rigid printed circuit board (PCB) or other suitable types of printed circuit substrates. Board components may be interconnected through conductive traces and packaging (e.g., sockets into which integrated circuits are mounted) formed on board 8. The example of FIG. 2 in which integrated circuit 10 and memory module 30 are formed as separate components on circuit board 8 is merely illustrative. If desired, integrated circuit 10 and memory module 30 may be formed together as a single component or a single package that may be mounted on circuit board 8. For example, integrated circuit 10 and memory module 30 may be formed as respective integrated circuit die that are stacked to form a single integrated circuit, which may be sometimes referred to as a 3D integrated circuit. In this scenario, paths such as path 40 between the integrated circuit die and memory module 30 may be formed from through-silicon vias that interconnect integrated circuit 10 and memory module 30 (e.g., vias through a silicon substrate of integrated circuit 10 or memory module 30). As another example, integrated circuit 10 and memory module 30 may each be coupled to an interposer (e.g., to a top surface of the interposer). In this scenario, the interposer may include a substrate and traces on the substrate may form path 40 between integrated circuit 10 and memory module 30. The interposer may be mounted to circuit board 8. Arrangements in which two or more integrated circuit die are coupled to an interposer may be sometimes be referred to as 2.5D integrated circuits.

Device 10 may include input-output circuitry 12 that interfaces between device 10 and external memory module 30. Input-output circuitry 12 may include memory interface circuitry 32. Device 10 may include memory controller circuitry 34 that serves to relay information between memory module 30 and logic circuits 18 that are internal to device 10. Memory controller 34 may, for example, be implemented using logic circuits 18, may be formed as a portion of input-output circuitry 12, or may be formed on any other desired portions of device 10. Read/write data may be conveyed between memory controller circuitry 34 and programmable circuitry 18 via paths 43. Memory controller 34 may be configured to generate appropriate control signals $CMD_C$ corresponding to the memory protocol currently under use (e.g., circuit 34 may handle memory data management to address desired banks, rows, and columns and to perform memory refresh). The example of FIG. 2 in which input-output circuitry 12 includes interface circuitry 32 is merely illustrative. If desired, interface circuitry 32 and memory controller circuitry 34 may be referred to collectively as a memory controller or portions of interface circuitry and memory controller circuitry may be combined. For example, input-output circuitry 12 may include modular input-output circuits that each contain memory controller and interface circuitry and are collectively configured to implement memory controller 34.

Input-output circuitry 12 may be coupled to memory module 30 through path 40. During memory read operations, data (DQ) signals may be conveyed from memory module 30 to memory controller circuitry 34 over path 40 and using memory interface circuitry 32. During memory write operations, DQ may be conveyed from memory controller circuitry 34 to memory module 30 over path 40 and using memory interface circuitry 32.

Device 10 may include clock generation circuitry 36 that generates clock signals such as controller clock signal $CLK_C$ and memory clock signal $CLK_M$. Clock generation circuitry 36 may include any desired clock generation circuitry such as phase-locked loops (PLLs), delay-locked loops (DLL), resonant circuits, or other clock circuitry. Clock generation circuitry 36 may provide controller clock signal $CLK_C$ to interface circuitry 32, memory circuitry 34, logic circuits 18, and other circuitry on device 10 over paths 38. Controller clock signal $CLK_C$ may be used to control communications between memory controller 34 and on-chip logic circuitry 18. Memory clock signal $CLK_M$ may be provided to interface circuitry 32 over path 38 and may be used in capturing data from memory module 30. For example, clock signal $CLK_M$ may be used to generate a memory interface strobe signal for reading data from memory module 30.

Device 10 may include calibration circuitry 46. For example, calibration circuitry 46 may be implemented using programmable logic circuits 18 (e.g., as one or more calibration sequencers on logic circuits 18). Calibration circuitry 46 may perform calibration operations on device 10. For example, calibration circuitry 46 may calibrate clock signals and/or strobe signals received from clock circuitry 36 for interfacing with memory module 30. Calibration circuitry 46 may retrieve calibration data such as calibration data 28 stored on user memory 26. Calibration circuitry 46 may use calibration data 28 to synchronize clock signals received by input-output circuitry 12 from clock circuitry 36 with data received from memory module 30.

Non-volatile configuration memory 22 may be coupled to input-output circuitry 12 and internal logic circuitry 18. Configuration data may be stored on configuration memory 22 using I/O pins 14. Logic circuitry 18 may load configuration data such as configuration images 24 stored on configuration memory 22 (e.g., configuration memory 22 may provide configuration images 24 to logic circuitry 18 over path 16). Configuration data and other desired data may be passed between configuration memory 22 and input-output circuitry 12 over path 44.

User memory 26 may be coupled to input-output circuitry 12 and internal logic circuitry 18. Internal logic circuitry 18 may provide user data and calibration data 28 (FIG. 1) over path 16 for storage on user memory 26. Calibration circuitry 46 may retrieve some or all of calibration data 28 from user memory 26. Calibration circuitry 46 may use calibration data 28 to calibrate clock signals received from clock circuitry 36 and/or read enable control signals for interfacing with memory module 30.

Memory such as memory module 30 often operates at high clock speeds such as 800 MHz or 1600 MHz. It can be challenging for on-chip circuitry such as programmable logic 18 that operates at somewhat reduced speeds (e.g., 200 MHz, 400 MHz, etc.) to perform memory accesses at the high speeds of the memory. Memory controller 34 and interface circuitry 32 may be operated in modes such as quarter rate or half rate modes to accommodate differences in operating speed between on-chip circuitry and memory.

In half rate mode, the bit-width of data provided by on-chip circuitry to memory controller 34 (e.g., over paths 43) may be quadrupled relative to the bit-width of data provided by interface circuitry 32 to external memory (e.g., over path 40). By multiplying the bit-width by four, the on-chip circuitry may be operated at half of the memory clock rate while maintaining overall data throughput between the on-chip circuitry and the external memory. Similarly, in quarter rate mode, the on-chip system clock speed may be a quarter of the memory clock speed and the data width between on-chip circuitry and interface circuitry 32 may be eight times the data width between memory controller 34 and the external memory. In such scenarios, it may be especially challenging to synchronize memory controller operations with external memory operations. For example, complex calibration circuitry may be required to perform calibration operations in matching on-chip clock signals with signals received from the external memory.

The arrangement of FIG. 2 is merely illustrative and is not intended to limit the scope of the present invention. Integrated circuits other than programmable integrated circuits may similarly include input-output circuitry 12 having memory controller circuitry that is used to communicate with one or more memory modules 30. If desired, some or all of configuration memory 22 may be formed together with user memory 26 (e.g., as combined non-volatile memory). Configuration memory 22 and/or user memory 26 may be formed on circuit board 8 separate from integrated circuit 10, on a common substrate as integrated circuit 10, on a common substrate as memory module 30, on a substrate that is separate from circuit board 8, stacked relative to integrated circuit 10, or at any other desired location.

During memory read and write operations, memory clock signal $CLK_M$ may be used to generate a memory interface strobe signal for capturing incoming data from module 30. If care is not taken, strobe signals may be misaligned with respect to the incoming data, causing device 10 to read erroneous data. For example, board skew such as caused by signal delay across traces can result in misalignment between the strobe signals and the incoming data.

Figure 3:
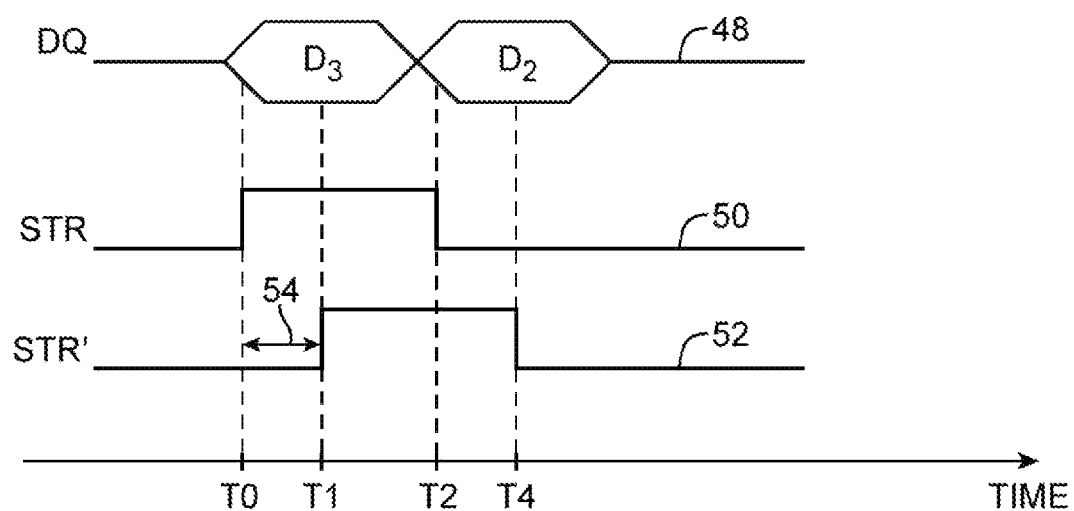
FIG. 3 is a timing diagram showing how memory interface strobe signals may be center-aligned with incoming data received from an external memory module in accordance with an embodiment of the present invention.

FIG. 3 is an illustrative timing diagram showing how strobe signals used for capturing data from memory module 30 may be aligned with respect to the incoming data for mitigating data read errors. As shown in FIG. 3, waveform 48 illustrates incoming data DQ received by interface circuitry 32 from memory module 30. Data DQ may include data portions $D_3$ and $D_2$. Data portions $D_3$ and $D_2$ may each include 1 bit data, 2 bit data, 8 bit data, 16 bit data, 32 bit data, a number of bits corresponding to the number of pins connected between memory module 30 and input-output circuitry 12, or any other desired data. Upon first receiving data 48 from memory module 30, memory interface strobe signal STR generated by device 10 for interfacing with memory module 30 can be misaligned with respect to the incoming data, as shown by line 50. When strobe signals at interface 32 are misaligned with incoming data 48, the rising and/or falling edges of the strobe signal may occur during time periods where data 48 is unresolved. In the example of FIG. 3, the rising edge of strobe signal 50 occurs at time T0 and the falling edge of strobe 50 occurs at time T2, during transition periods of the DQ signals (e.g., DQ may be transitioning between $D_2$ and $D_3$ and may not be fully resolved). Strobe signal 50 may thereby be considered to be misaligned with respect to data 48.

If desired, strobe signal 50 may be calibrated so that the rising and falling edges of the strobe signal occur during time periods when the incoming data is fully resolved. For example, as shown by line 52, interface circuitry 32 or clock circuitry may generate strobe signal STR' by shifting the phase of strobe signal STR by margin 54. The rising edge of strobe signal 52 may occur at time T1 during which data $D_3$ is fully resolved and the falling edge of strobe 52 may occur at time T4 during which data $D_3$ is fully resolved (e.g., the rising edge of strobe 52 may occur at the center of the data window associated with data $D_3$ and the falling edge of strobe 52 may occur at the center of the data window associated with data $D_2$). Calibration of strobe signals at interface 32 may help to accommodate device variations (e.g., process, voltage, and temperature variations) that may occur during manufacturing or normal operation of device 10. For example, aligned strobe signal 52 may include temporal margins between the rising and falling edges of strobe signal STR' and the edges of the data windows associated with data $D_3$ and $D_2$ in order to allow for operational variations of device 10 (e.g., to ensure that strobe signal STR' has rising and falling edges at times when data DQ is fully resolved even in the presence of device variations). Interface circuitry 32 may include delay circuitry or other strobe signal alignment circuitry that is configured by calibration data to shift and align strobe signals with the incoming data.

Figure 4:
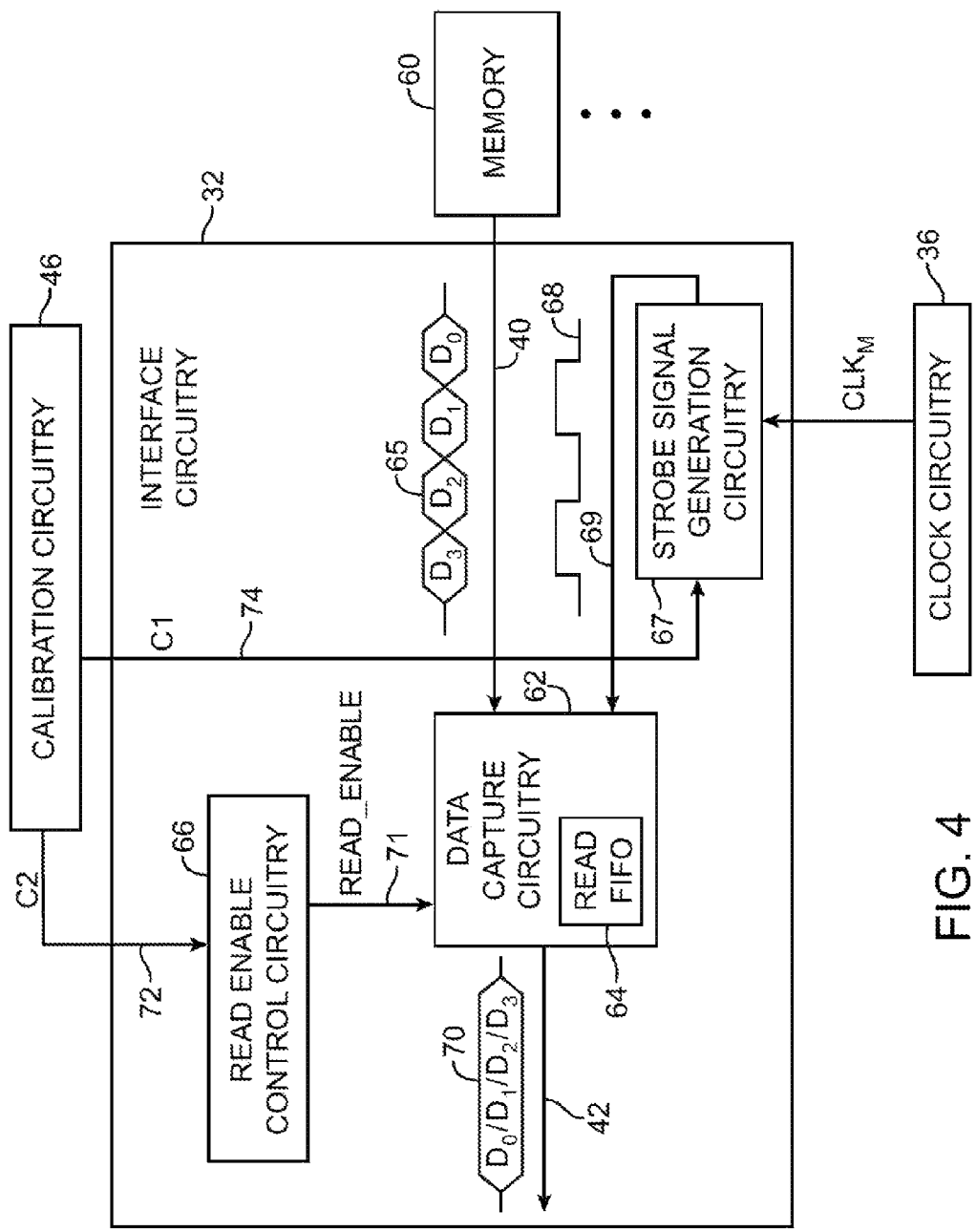
FIG. 4 is a diagram of illustrative memory interface circuitry that may be calibrated for an external memory module by calibration circuitry in accordance with an embodiment of the present invention.

FIG. 4 is an illustrative diagram showing how calibration circuitry 46 may calibrate interface circuitry 32 to ensure that data received from memory module 30 is synchronized with clock signals on device 10. As shown in FIG. 4, interface circuitry 32 may include read enable control circuitry 66, data capture circuitry 62, and strobe generation circuitry 67. This example is merely illustrative and does not serve to limit the scope of the present invention. If desired, read enable control circuitry 66 may be formed separately from interface circuitry 32 (e.g., on logic 18 of FIG. 1).

Calibration circuitry 46 may retrieve calibration data 28 from user memory 26 (FIG. 2) and may generate control signals C1 and C2 based on calibration data 28. Calibration circuitry 46 may provide control signals C2 to read enable control circuitry 66 over path 72. Control signals C2 may include portions of calibration data 28, may include control signals that identify portions of calibration data 28, or may include any other desired control signals. Calibration control circuitry 46 may provide control signals C1 to strobe generation circuitry 67 over path 74. Control signals C1 may include portions of calibration data 28, may include control signals that identify portions of calibration data 28, or may include any other desired control signals.

If desired, strobe signal generation circuitry 67 may include local clock generation circuitry such as phase-locked loops (PLLs), delay-locked loops (DLL), resonant circuits, or other desired local clock circuitry or strobe signal generation circuitry. Local clock circuitry 67 may receive memory clock signal $CLK_M$ from clock circuitry 36 (FIG. 2). Strobe signal generation circuitry 67 may use clock signal $CLK_M$ to generate memory interface strobe signal 68. Strobe signal generation circuitry 67 may include delay circuitry or other strobe signal alignment circuitry that can adjust the phase of strobe signal 68 to align strobe signal 68 with data 65. Strobe signal generation circuitry 67 may align strobe signal 68 using calibration data received from calibration circuitry 46. For example, control signal C1 may identify a phase shift for strobe signal 68 that will align strobe signal 68 with data 65. Strobe signal generation circuitry 67 may apply the identified phase shift to strobe signal 68 so that strobe signal 68 is aligned with data 65. As an example, strobe signal generation circuitry 67 may be configured to delay strobe signal 68 so that the rising edges and falling edges of the data strobe signal clocks at the center of each data window associated with data 65.

The example of FIG. 4 is merely illustrative. If desired, calibration circuitry 46 may provide control signals C1 to additional clock circuitry formed on interface 32 and/or to clock circuitry 36 for controlling clock signals and strobe signals used by device 10. Strobe signal generation circuitry 67 may be formed on device 10 separate from interface circuitry 32 or as a part of clock circuitry 36. If desired, calibration circuitry 46 may be formed as a part of interface circuitry 32.

Read enable control circuitry 66 may generate read enable control signal READ_ENABLE based on control signals C2 received from calibration circuitry 46. Control signals C2 may define read enable control signal generation settings. The read enable control signal generation settings may include, for example, read enable timing settings, read enable latency settings, or any other desired settings. Read enable control circuitry 66 may generate read enable control signal READ_ENABLE using the read enable control signal generation settings identified by control signals C2. For example, circuitry 66 may generate read enable control signal READ_ENABLE having a selected read enable latency or other selected read enable timing settings. Control circuitry 66 may provide read enable control signal READ_ENABLE to data capture circuitry 62 over path 71. Data capture circuitry 62 may produce captured data 70 on path 42 based on read enable control signal READ_ENABLE. For example, buffer 64 in data capture circuitry 62 may capture and store data on path 40 based on strobe signal 68 and may provide the captured data on path 42 based on the READ_ENABLE signal.

Device 10 may interface with any number of memory modules 30 each having any number of memory groups 60. Data capture circuitry 62 may receive data 65 from memory group 60 in memory module 30 over line 40. Data 65 may include portions $D_3$, $D_2$, $D_1$, $D_0$ each having bit-widths corresponding to the bit-width of data paths 40 between memory 60 and device 10. This example is merely illustrative. Data 65 may include any desired number of portions. The number of data portions may sometimes be referred to as a burst length.

Data capture circuitry 62 may receive strobe signal 68 from strobe signal generation circuitry 67 over path 69. Data capture circuitry 62 may include latching circuitry that serves to latch data signals 65 at the rising and falling edges of strobe signals 68. Data signals 65 received by data capture circuitry 62 may be updated at both rising and falling edges of strobe 68. Data transfer of this type may sometimes be referred to as double data rate (DDR) transmission. Data capture circuitry 62 may include storage circuitry such as read first-in-first-out (FIFO) buffer circuitry 64. Read FIFO buffer 64 may receive read enable control signal READ_ENABLE from read enable control circuitry 66. Read FIFO buffer 64 may be controlled by read enable control signal READ_ENABLE to enable data output from data capture circuitry 62. For example, control signal READ_ENABLE may be asserted to allow user logic to read data from read FIFO 64. Read FIFO buffer 64 may output data 70 at half of the data rate of incoming data 65, for example (e.g., for two clock cycles of strobe signal 68 during which data D0, D1, D2, and D3 are received over path 40 from memory 60, read FIFO 64 may output combined data D0-D3 during a single controller clock cycle operating at half of the clock speed of strobe signal 68). The timing of control signal READ_ENABLE may be determined by read enable control circuitry 66 (e.g., based on calibration data 28 received from circuitry 46).

Memory interface circuitry 32 may be calibrated prior to normal user operation of device 10 for generating calibration data 28. For example, device 10 may be configured to operate in a calibration mode during which device 10 generates calibration data 28. Device 10 may subsequently be configured to operate in a user mode in which device 10 is configured with custom user logic. Calibration data 28 may be provided to calibration circuitry 46 prior to reading data from external memory 60 during normal user operation (e.g., during the user mode). Calibration circuitry 46 may generate control signals C1 and C2 based on calibration data 28 (e.g., control signals C1 and C2 may identify some or all of calibration data 28). Interface circuitry 32 may use calibration data 28 to align strobe signal 68 with incoming data 65 (e.g., as shown by aligned strobe signal 52 of FIG. 3).

Programmable logic 18 on device 10 (FIG. 2) may load a calibration image from configuration memory 22 to configure device 10 to operate in calibration mode. An illustrative diagram of a calibration image that may be loaded onto programmable logic 18 from configuration memory 22 of FIG. 2 is shown in FIG. 5.

Figure 5:
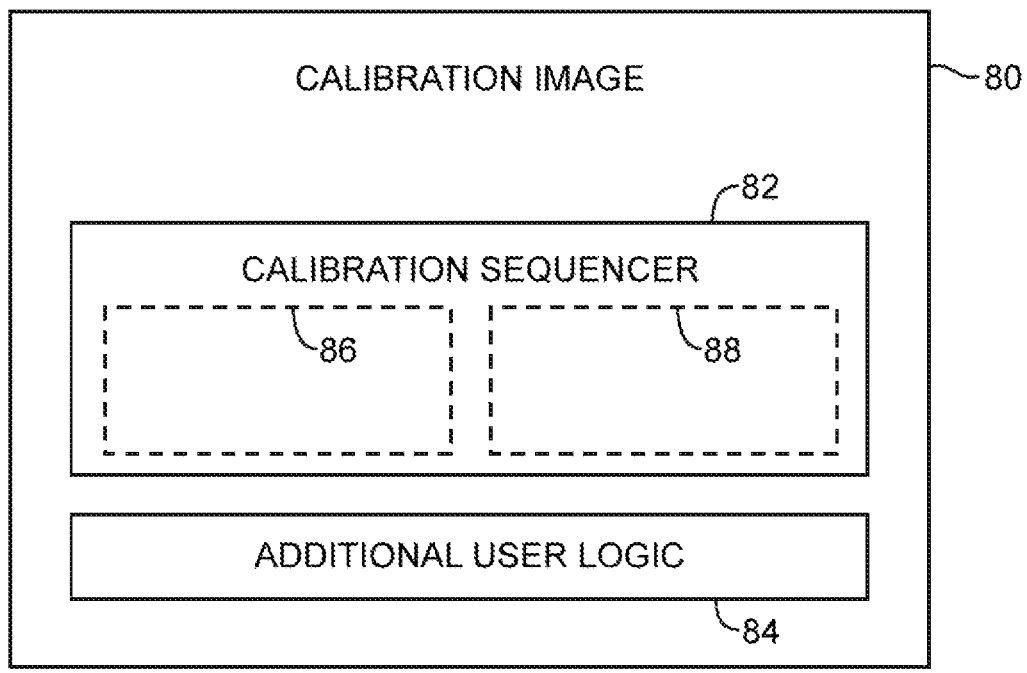
FIG. 5 is a diagram of an illustrative calibration configuration image that may be stored on non-volatile memory in a programmable integrated circuit device and that may be loaded into programmable logic circuitry for generating calibration data in accordance with an embodiment of the present invention.

As shown in FIG. 5, calibration image 80 may be loaded into configuration memory 22. Calibration image 80 may include calibration sequencer 82. Calibration sequencer 82 may configure programmable logic circuitry 18 (FIG. 2) to perform calibration operations when calibration image 80 is loaded into programmable logic circuitry 18. When loaded into programmable logic circuitry 18, calibration sequencer 82 may occupy regions 86 and 88 of programmable logic circuitry 18. Calibration image 80 may also include additional user logic 84 that can be programmed by a user to perform any desired logic functions.

Figure 6:
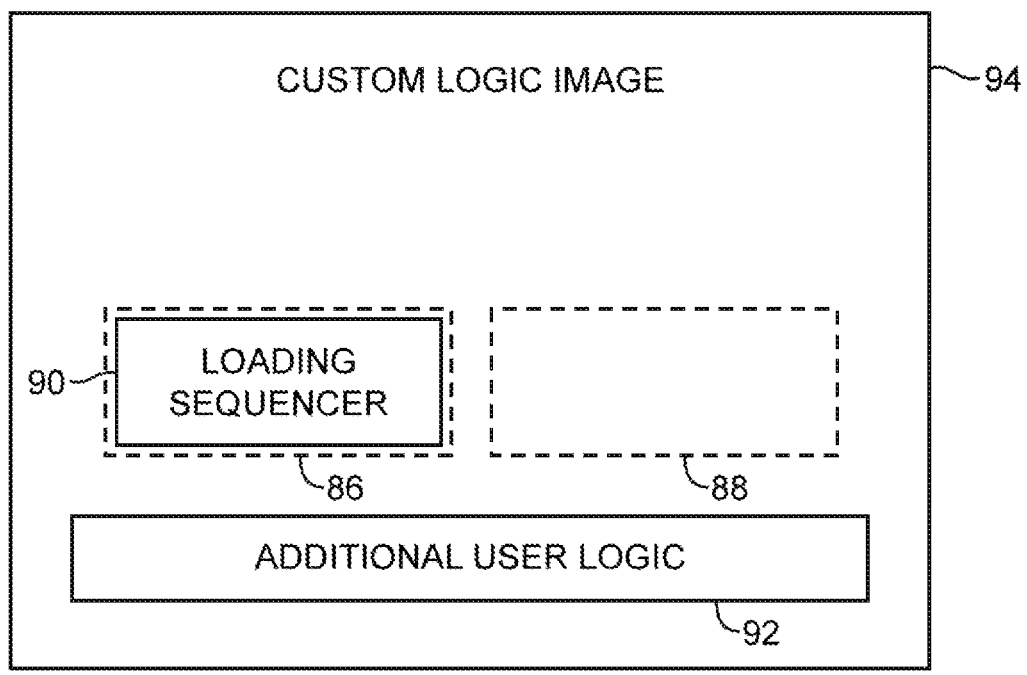
FIG. 6 is a diagram of an illustrative custom user logic configuration image that may include a custom user logic design and calibration data loading circuitry in accordance with an embodiment of the present invention.

Programmable logic 18 on device 10 may load a custom logic image from configuration memory 22 to configure device 10 to synchronize memory interface strobe signals with incoming data from external memory. An illustrative diagram of a custom logic image that may be loaded onto programmable logic 18 from configuration image 22 of FIG. 2 is shown in FIG. 6. As shown in FIG. 6, custom logic image 94 may be loaded into configuration memory 22. Custom logic image 94 may include loading sequencer 90. Loading sequencer 90 may configure programmable logic circuitry 18 to retrieve calibration data 28 from user memory 26 when custom logic image 94 is loaded into programmable logic circuitry 18. For example, loading sequencer 90 may configure logic circuitry 18 to load calibration data 28 and provide calibration data 28 to calibration circuitry 46 for synchronizing memory interface strobe signals 68 with data 65.

When custom logic image 94 is loaded into programmable logic circuitry 18, loading sequencer 90 may occupy region 86 of programmable logic circuitry 18. Custom logic image 94 may include additional user logic 92 that can be programmed by a user to perform any desired logic functions. Since region 88 of custom logic image 94 is not used for implementing loading sequencer 90, region 88 remains free for additional user logic such as user logic 92 when custom logic image 94 is loaded into programmable logic circuitry 18.

In this way, logic circuitry 18 may have more logic resources free for additional user logic when custom logic image 94 is loaded into logic circuitry 18 than when calibration image 80 is loaded into logic circuitry 18. For example, calibration sequencer 82 may occupy about 1600 logic elements in logic circuitry 18, whereas loading sequencer 90 may occupy only about 600 logic elements in logic circuitry 18. In general, loading sequencer 90 may occupy half as many logic elements on circuitry 18 than calibration sequencer 82, one-quarter as many logic elements, one-tenth as many logic elements, less than one-tenth as many logic elements, or any other desired ratio of logic elements relative to calibration sequencer 82 (e.g., depending on the complexity of calibration sequencer 82).

Figure 7:
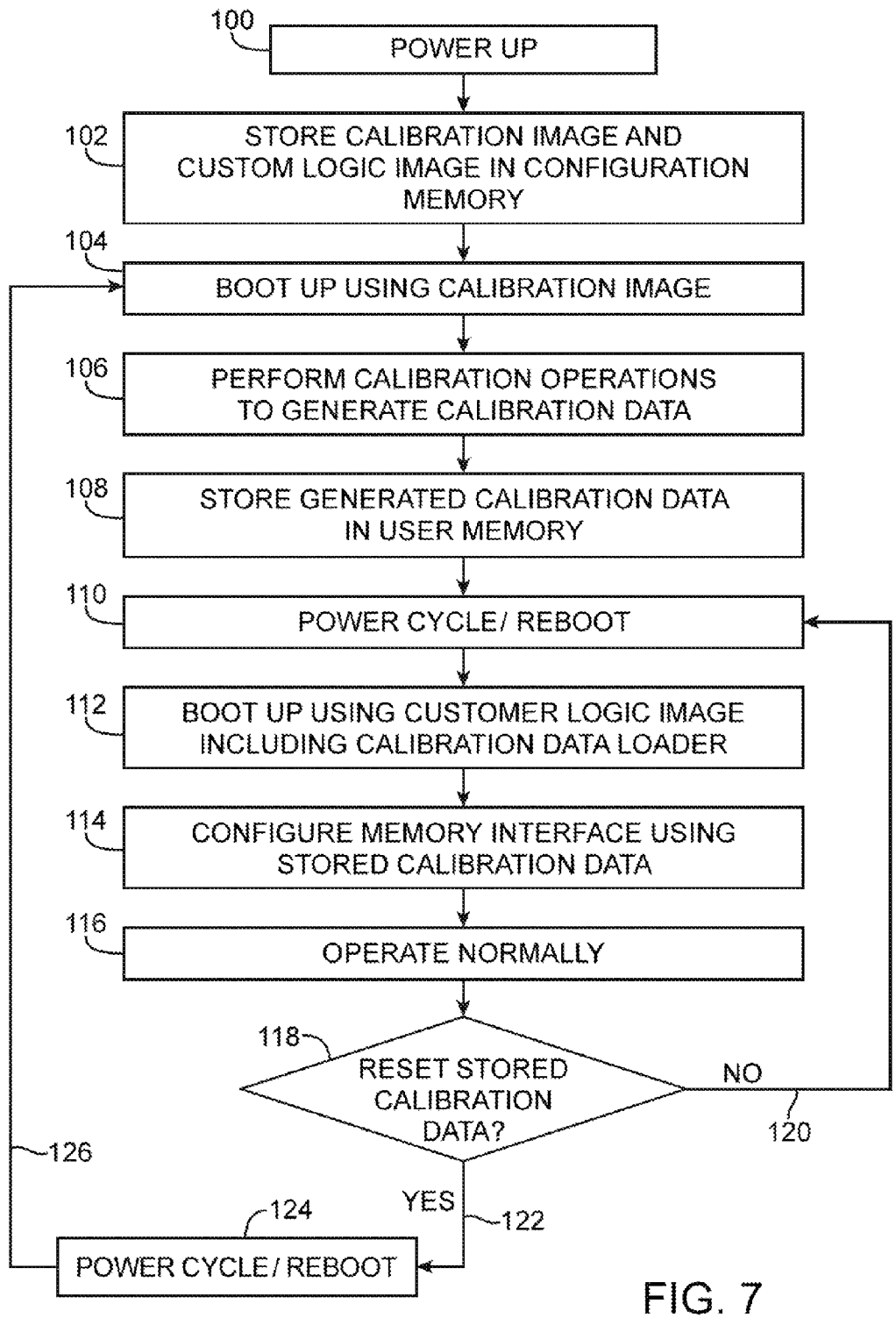
FIG. 7 is a flow chart of illustrative steps that may be performed by a programmable integrated circuit device to generate calibration data using a first device configuration and to load calibration data for normal operation using a second device configuration in accordance with an embodiment of the present invention.

FIG. 7 is a flow chart of illustrative steps that may be performed by programmable logic device 10 to generate calibration data 28 using a first device configuration and to load calibration data 28 using a second device configuration so that memory interface strobe signals 68 are aligned with incoming data 65 received from external memory 30.

At step 100, device 10 and memory module 30 may be powered-up.

At step 102, two or more configuration images 24 may be stored in configuration memory 22 (FIG. 1). Configuration images 24 may be loaded onto CFM 22 via I/O circuitry 12 and pins 14 (e.g., by a user of device 10). Configuration images 24 stored on configuration memory 22 may include, for example, a calibration image that configures portions of logic circuitry 18 to perform calibration operations (e.g., that configures portions of logic circuitry 18 to generate calibration data 28) and a custom logic image that configures device 10 to use calibration data 28 for synchronizing strobe signals 68 with data 65 during normal operation of device 10 (e.g., normal operation of custom user logic).

At step 104, device 10 may boot up using calibration image 80 (e.g., calibration image 80 may be loaded into programmable logic circuitry 18 from configuration memory 22). Calibration sequencer 82 in image 80 (FIG. 5) may configure portions of programmable logic circuitry 18 to perform calibration operations for generating calibration data 28.

At step 106, device 10 may perform calibration operations to generate calibration data 28. Calibration sequencer 82 in calibration image 80 may configure device 10 to read data from memory module 30 and to generate calibration data 28 based on the read data. Calibration data 28 may identify, for example, delay settings (e.g., strobe signal phase settings) that can be used to align strobe signal 68 with data received from memory 30, and one or more read enable signal settings (e.g., read enable timing settings) that can be used to generate read enable control signal READ_ENABLE (FIG. 4).

At step 108, device 10 may store calibration data 28 in user memory such as user memory 26 of FIGS. 1 and 2. This example is merely illustrative and does not serve to limit the scope of the present invention.

At step 110, device 10 may perform a power cycle (e.g., device 10 may be rebooted). If desired, device 10 may autonomously perform a power cycle or reboot operation (e.g., using instructions stored in logic circuitry 18 without input from a user). In another suitable arrangement, a user of device 10 may manually power cycle or reboot device 10 (e.g., by providing user input to device 10 over I/O circuitry 12 and pins 14). These examples are merely illustrative. If desired, device 10 may perform dynamic reconfiguration without rebooting for steps 112-114.

At step 112, device 10 may boot up with or otherwise load custom logic image 94 (e.g., custom logic image 94 may be loaded into programmable logic circuitry 18 from configuration memory 22). For example, loading sequencer 90 and custom user logic may be loaded into logic circuitry 18.

At step 114, device 10 may configure memory interface circuitry 32 using calibration data 28 stored on user memory 26. For example, loading sequencer 90 on logic circuitry 18 may configure calibration circuitry 46 to retrieve stored calibration data 28 from user memory 26 and to provide control signals C1 and C2 (FIG. 4) to interface circuitry 32 based on calibration data 28.

At step 116, device 10 may perform normal operations such as normal memory read and write operations. During memory read operations, read enable control circuitry 66 and strobe signal generation circuitry 67 in interface circuitry 32 may use calibration data 28 to synchronize memory interface strobe signal 68 with data 65 to ensure correct data is read from memory module 30.

At step 118, device 10 may determine whether to reset stored calibration data 28. For example, a user may input a command to device 10 to reset calibration data 28 (e.g., via I/O circuitry 12 and pins 14 as shown in FIG. 1). In another suitable arrangement, device 10 may autonomously determine whether to reset stored calibration data 28. For example, device 10 may reset stored calibration data 28 after a predetermined number of power cycles, after a predetermined length of time, after certain operating conditions of device 10 are met, if one or more errors are detected in the read data, etc.

If device 10 determines not to reset stored calibration data 28, processing may loop back to step 110 via path 120 to continue normal operations. If device 10 determines that calibration data 28 is to be reset, processing may proceed to step 124 over path 122. At step 124, device 10 may perform a power cycle and/or reboot operation. Processing may subsequently loop back to step 104 (as shown by path 126) to boot up device 10 using calibration image 80 for generating new calibration data 28.

Figure 8:
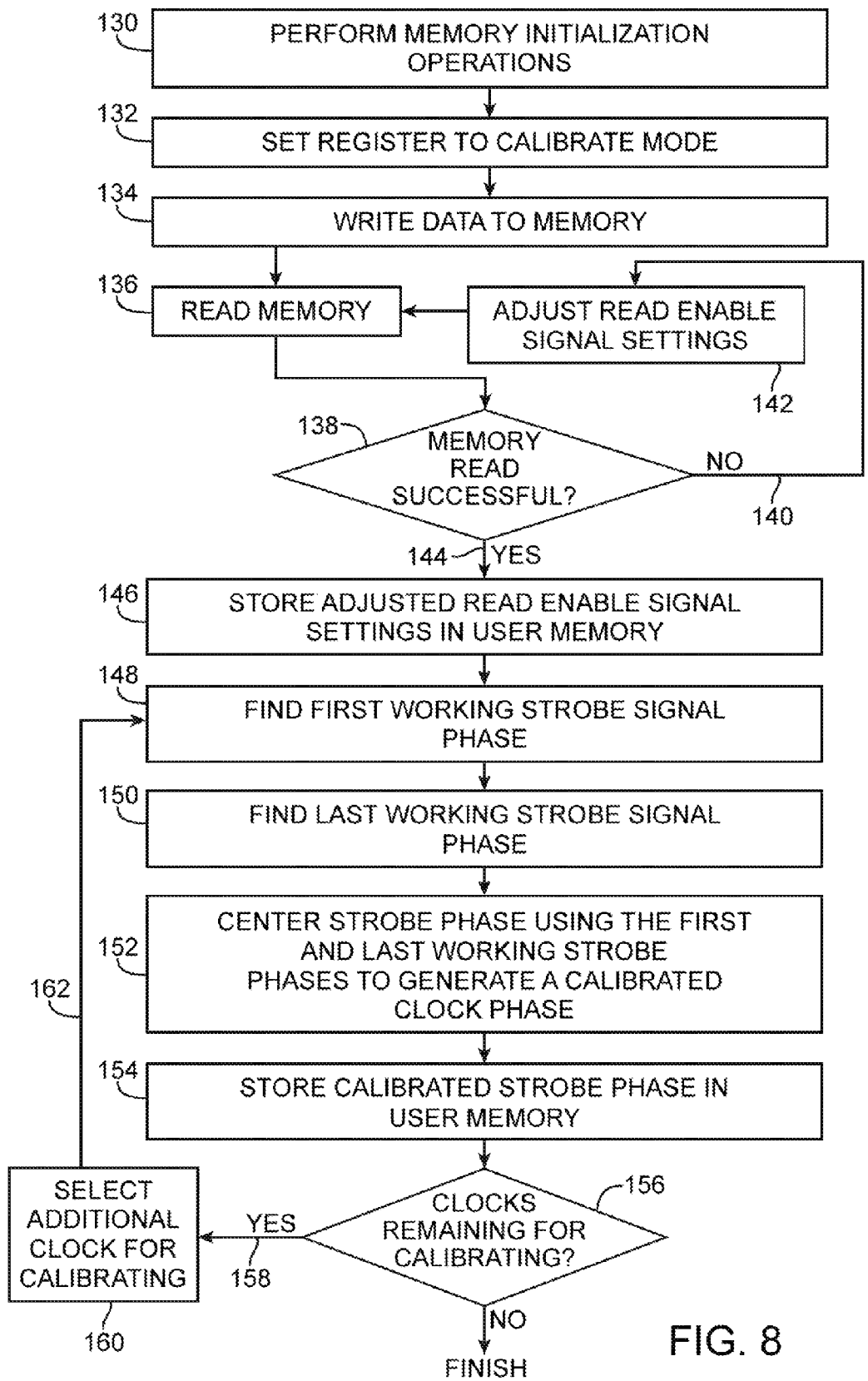
FIG. 8 is a flow chart of illustrative steps that may be performed by circuitry configured with a calibration configuration image to generate calibration data for memory interface circuitry in accordance with an embodiment of the present invention.

FIG. 8 is a flow chart of illustrative steps that may be performed by device 10 to generate and store calibration data 28 for synchronizing strobe signal 68 with incoming data 65. The steps of FIG. 8 may be performed by device 10 after booting up device 10 using calibration image (e.g., the steps of FIG. 8 may be performed while processing steps 106 and 108 of FIG. 7). For example, the steps of FIG. 8 may be performed by calibration sequencer 82 of device 10.

At step 130, device 10 may perform memory initialization operations on memory module 30). For example, device 10 may transmit and receive control signals from the external memory to initialize the external memory. If desired, clock circuitry 36, strobe signal generation circuitry 67, and data capture circuitry 62 may be initialized in preparation for reading data from memory module 30.

At step 132, memory module 30 may be configured in calibration mode during which device 10 performs calibration operations. For example, calibration circuitry 46 may communicate with memory module 30 to set one or more registers of memory module 30 to calibration mode. Memory module 30 may be set to calibration mode autonomously (e.g., using instructions located in calibration image 80 or other portions of programmable logic circuitry 18) or may be set to calibration mode manually by a user (e.g., using a user input provided over I/O circuitry 12 and pins 14).

At step 134, calibration circuitry 46 may use the interface circuitry to perform a write operation to write test data to memory module 30. The test data may be written to a desired memory address for testing.

At step 136, calibration circuitry 46 may use the interface circuitry to perform read operations to retrieve the test data from memory module 30. The calibration circuitry may read the data from memory module 30 using control signals produced using initial settings. For example, the control signals may include an initial memory interface strobe signal 68 having an initial phase and an initial read enable signal control READ_ENABLE.

At step 138, the calibration circuitry may determine whether the memory read was successful. For example, calibration circuitry 46 may process the read data to determine whether the read data matches the write data (e.g., device 10 may determine whether the read data includes any errors). If the read data includes any errors (or an excessive number of errors exceeding a predetermined threshold), device 10 may determine that the memory read operation was unsuccessful and processing may proceed to step 142 as shown by path 140.

At step 142, calibration circuitry 46 may adjust the read enable control signal settings that are used by read enable control circuitry 66 to generate control signal READ_ENABLE. For example, calibration circuitry 46 may instruct read enable control circuitry 66 to adjust the timing of read enable control signal READ_ENABLE. Processing may subsequently loop back to step 136 to read data from memory module 30 using the adjusted read enable control signals.

If the read data includes no errors (or an acceptably low number of errors), processing may proceed to step 146 as shown by path 144. At step 144, device 10 may store the adjusted read enable signal settings in user memory 26 (e.g., the adjusted read enable signal settings with which device 10 successfully read data from memory module 30 may be stored at user memory 26 as a portion of calibration data 28).

At step 148, device 10 may identify a first working phase for strobe signal 68. For example, device 10 may scan through different phases of strobe signal 68 in a sequence (e.g., of increasing phase or decreasing phase) while reading data 65 from memory 30 (e.g., by generating strobe signals 68 with various phases). While scanning through different phases of strobe signal 68, device 10 may identify a first phase of strobe signal 68 at which data 65 is aligned with strobe signal 68 (e.g., the first phase of strobe signal 68 during the scan at which the rising and falling edges of strobe signal 68 are aligned with fully resolved portions of data signal 65). Device 10 may continue to scan through different phases of strobe signal 68.

At step 150, device 10 may find a last working phase for strobe signal 68 (e.g., device 10 may identify a last phase during the scan after which strobe signal 68 is no longer aligned with fully resolved portions of data 65). For example, device 10 may identify the last phase for which the rising and falling edges of strobe signal 68 are aligned with the fully resolved portions of data 65 during the scan of strobe signal phases.

At step 152, device 10 may center the phase of strobe signal 68 using the first working phase and the last working phase. For example, device 10 may generate a calibrated (centered) strobe phase by averaging the first working phase and the last working phase. The calibrated strobe phase may be well-aligned with incoming data 65 to help minimize errors in data read by data capture circuitry (e.g., the rising and falling edges of strobe signal 68 having the calibrated strobe phase may occur during time periods at which data 65 is fully resolved). By using a centered strobe phase, interface circuitry 32 may ensure that a sufficient temporal margin is provided between the rising and falling edges of strobe signal 68 and unresolved portions of data 65.

At step 154, device 10 may store the calibrated strobe phase settings in user memory 26 (e.g., the centered strobe phase may be stored in user memory 26 as a portion of calibration data 28). This is merely illustrative and does not serve to limit the scope of the present invention. If desired, any other calibration data associated with interfacing with and reading data from memory module 30 may be stored in user memory 26.

At step 156, device 10 may determine whether there are additional clock signals (e.g., strobe signals) remaining for calibration (e.g., additional clock signals generated by strobe signal generation circuitry 67, additional clock signals generated by other clock circuitry within interface circuitry 32, additional clock signals generated by clock circuitry 36, etc.). If clock signals remain for calibration, processing may proceed to step 160 as shown by path 158.

At step 160, device 10 may select an additional clock signal for calibrating (e.g., additional clock signals for which to generate calibration data for synchronizing the clock signal with incoming data). If desired, device 10 may select additional read enable control signals for calibrating (e.g., for additional memory modules 30). Processing may subsequently loop back to step 148 to find calibrated phases for the additional clock/strobe and/or read enable control signals. If no clock signals remain for calibration, processing may proceed to step 166 as shown by path 164. If no clocks remain for calibrating, calibration operations may be completed.

Figure 9:
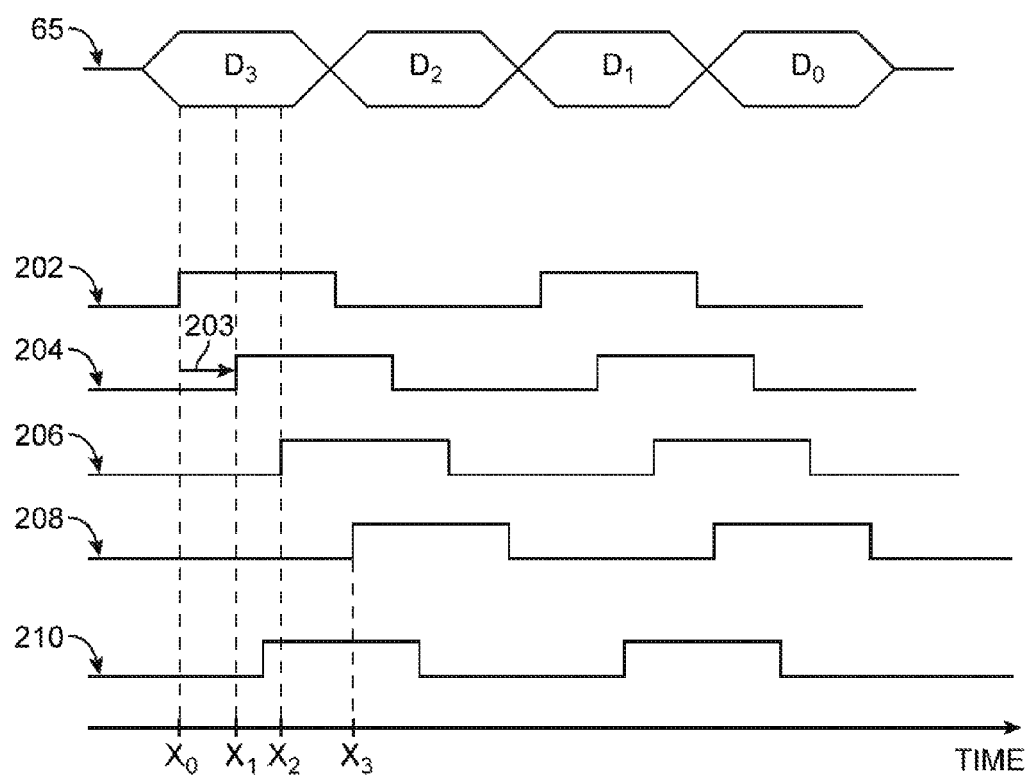
FIG. 9 is a timing diagram illustrating how the phase of a memory interface strobe signal may be adjusted during calibration operations in accordance with an embodiment of the present invention.

FIG. 9 is an illustrative timing diagram showing how a calibrated strobe signal having a calibrated strobe phase may be generated using strobe signals having different phases. As shown in FIG. 9, incoming data 65 may be read from memory module 30. Lines 202, 204, 206, and 208 illustrate strobe signals (e.g., strobe signals 68 as shown in FIG. 4) having different phases. Strobe signals 202, 204, 206, and 208 may be generated, for example, while processing steps 148-152 of FIG. 8.

Line 202 illustrates a first strobe signal having a first phase and a rising edge at time $X_0$. In the example of FIG. 9, the first falling edge of strobe signal 202 occurs after data $D_3$ is fully resolved and before data $D_2$ is fully resolved (e.g., during a time period when data 65 is not fully resolved). Data captured by data capture circuitry 62 using first strobe signal 202 may thereby include errors due to misalignment with data 65.

Line 204 illustrates a second strobe signal having a second phase and a rising edge at time $X_1$ (e.g., second strobe signal 204 may be shifted by margin 203 relative to first strobe signal 202). The rising and falling edges of strobe signal 202 each occur while data 65 is fully resolved. Data that is captured by data capture circuitry 62 using second strobe signal 204 may thereby be free from read errors because strobe signal 204 is aligned with data 65. In the example of FIG. 9, the phase of strobe signal 204 may be the first working strobe signal phase with which strobe signals 68 are aligned with data 65.

Line 206 illustrates a third strobe signal having a third phase and a rising edge at time $X_2$. The rising edges and the falling edges of strobe signal 206 may occur while data 65 is fully resolved. Data that is captured using third strobe signal 206 may thereby be free from read errors because strobe signal 206 is aligned with data 65. In the example of FIG. 9, the phase of strobe signal 206 may be the last working strobe signal phase with which strobe signals 68 are aligned with data 65.

Line 208 illustrates a fourth strobe signal having a fourth phase and a rising edge at time $X_3$. The first rising edge of strobe signal 208 may occur after data $D_3$ is fully resolved and before data $D_2$ is fully resolved (e.g., during a transition time period when data 65 is not fully resolved). Data captured by data capture circuitry 62 using fourth strobe signal 208 may thereby include errors due to misalignment with data 65.

Line 210 illustrates a calibrated strobe signal having a calibrated phase that is generated by averaging the phase of last working strobe signal 206 with the phase of first working strobe signal 204 (e.g., by generating a strobe signal having a phase centered between the phases of strobe signals 204 and 206). For example, strobe signal 204 may have a first working phase P1 and strobe signal 206 may have a last working phase P2. A calibrated phase P3 may be generated by the equation (P1+P2)/2. Calibrated strobe signal 210 may be generated having calibrated phase P3.

Figure 10:
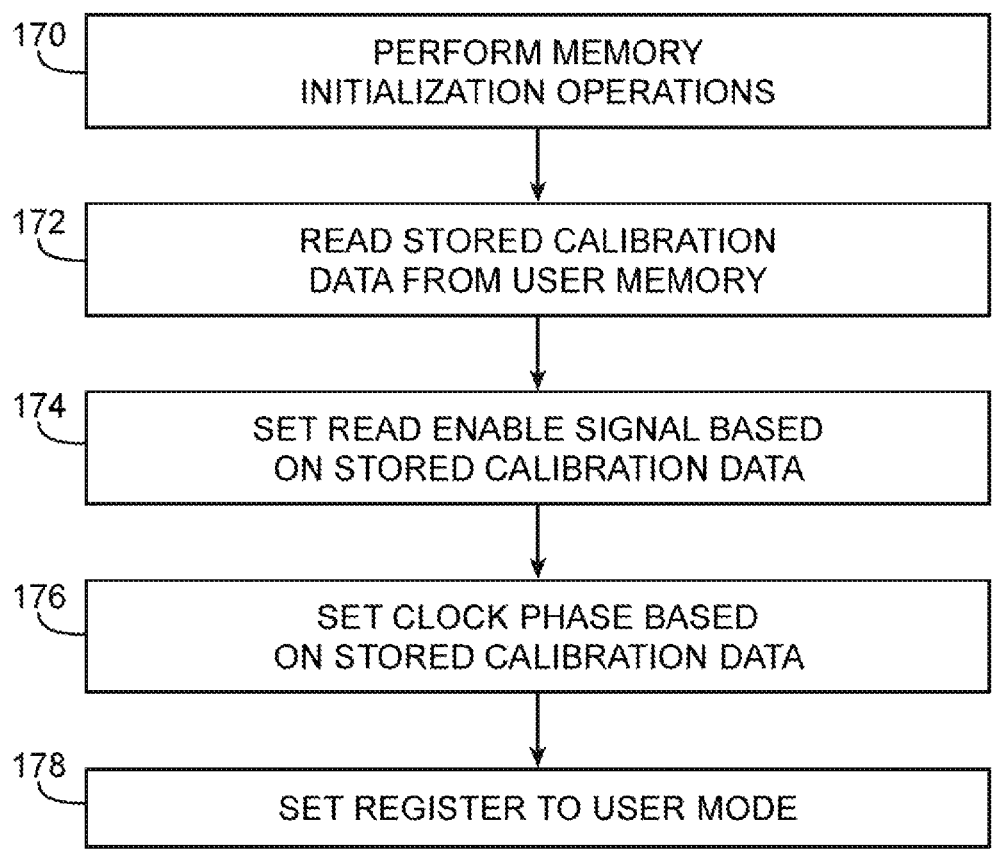
FIG. 10 is a flow chart of illustrative steps that may be performed by a programmable logic device configured with a data loading image to load calibration data for operating memory interface circuitry in accordance with an embodiment of the present invention.

FIG. 10 is a flow chart of illustrative steps that may be performed by device 10 to synchronize strobe signals 68 with incoming data from memory module 30 during normal operation of device 10. The steps of FIG. 10 may be performed after booting up device 10 using custom logic image 94 of FIG. 6 (e.g., the steps of FIG. 10 may be performed by device 10 while processing steps 114 and 116 of FIG. 7).

At step 170, device 10 may perform memory initialization operations on memory module 30 (e.g., on one or more memory groups 60 within memory module 30).

At step 172, device 10 may read calibration data 28 from user memory 26 (e.g., calibration data 28 stored on user memory 26 while processing step 108 of FIG. 7). For example, calibration circuitry 46 may load adjusted read enable control signal settings, strobe signal timing information such as strobe signal calibration phases, and/or other calibration data from user memory 26 (e.g., loading sequencer 90 may configure device 10 to read calibration data 28).

At step 174, calibration circuitry 46 may provide control signals C2 to read enable control circuitry 66 (FIG. 4) that identify the adjusted read enable control signal settings from calibration data 28. Control circuitry 66 may set the timing of read enable control signal READ_ENABLE using the received adjusted read enable control signal settings. For example, control circuitry 66 may set the timing (e.g., signal latency) of read enable control signal READ_ENABLE using the adjusted read enable control signal settings.

At step 176, calibration circuitry 46 may provide control signals C1 to strobe signal generation circuitry 67 that identify the timing with which to generate strobe signal 68. Strobe signal generation circuitry 67 may set the timing of strobe signal 68 based on calibration data 28. For example, strobe signal generation circuitry 67 may generate strobe signal 68 having the calibrated strobe signal phase identified by calibration data 28.

At step 178, device 10 may be set to a user mode during which device 10 may operate normally according to the custom user functions of logic circuitry 18. For example, one or more registers on device 10 may be set to user mode to enable normal (e.g., post-calibration) operations of the memory controller. Device 10 may be set to user mode autonomously (e.g., using instructions located in calibration image 80 or other portions of programmable logic circuitry 18) or may be set to calibration mode manually by a user (e.g., using a user input provided over I/O circuitry 12 and pins 14). When operated in user mode, device 10 may interface with memory module 30. For example, device 10 may read data from memory module 30 using the adjusted read enable signals READ_ENABLE (e.g., read enable signal generated by circuitry 66 using the adjusted read enable control signal settings) and using calibrated strobe signals generated by clock circuitry 67 using the calibrated strobe signal phase.

By loading calibration data 28 onto non-volatile memory such as user memory 26 and loading configuration images 80 and 94 onto non-volatile memory such as configuration memory 22, device 10 may help reduce the amount of resources used for synchronizing strobe signal 68 with data 65. As an example, loading sequencer 90 in calibration image 94 may occupy less space on programmable logic 18 than calibration sequencer 82 of FIG. 5 that performs full calibration functions (e.g., loading sequencer in device 90 may occupy 40%, less than 40%, or more than 40% of the logic elements that would be occupied by calibration sequencer 82).

In addition to occupying fewer logic elements on programmable circuitry 18, device 10 may have improved calibration speed and improved synchronization speed (e.g., the speed with which synchronization between strobe signal 68 and data 65 is performed). As an example, the speed with which device 10 generates calibration data 28 and synchronizes strobe signals 68 with data 65 may be greater than 35,000 times the speed with which initial calibration operations are performed while processing the steps of FIG. 7.

In general, device 10 uses more time to generate calibration data such as calibration data 28 than to load calibration data 28 and synchronize strobe signal 68. Because device 10 performs calibration operations during a single boot-up and loads calibration data from non-volatile memory on subsequent boot-ups (e.g., as shown in FIG. 5), device 10 may spend less time synchronizing memory interface strobe signals 68 with incoming data 65 from external memory than programmable logic circuitry that performs calibration and synchronization on each device boot-up. In this way, device 10 may have reduced power-up times before device 10 can be used normally by a user.

If desired, device 10 may include two capture clocks (e.g., two strobe signals may be generated by clock circuitry 67). In this scenario, calibration data for both capture clocks may be stored at the same address on user memory 22 so that user memory 22 only needs to be read once to load the calibration data onto calibration circuitry 46. While programmable logic circuitry without non-volatile circuitry may take longer to perform calibration and synchronization operations when two clocks are used, device 10 may take the same amount of time to perform calibration and synchronization regardless of whether one or two clocks are used.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
  memory interface circuitry that interfaces with external memory;
  storage circuitry; and
  calibration circuitry having a first configuration in which the calibration circuitry includes calibration data generation circuitry that generates and stores calibration data at the storage circuitry and a second configuration in which the calibration circuitry does not include the calibration data generation circuitry and in which the calibration circuitry loads the calibration data from the storage circuitry.

2. The integrated circuit defined in claim 1 wherein the integrated circuit comprises a programmable integrated circuit having programmable logic regions and wherein:
  in the first configuration, the calibration circuitry is formed from a first set of the programmable logic regions that are configured to generate and store the calibration data at the storage circuitry; and
  in the second configuration, the calibration circuitry is formed from a second set of the programmable logic regions that are configured to load the calibration data from the storage circuitry.

3. The integrated circuit defined in claim 2, wherein the second set of programmable logic regions comprises fewer programmable logic regions than the first set of programmable logic regions.

4. The integrated circuit defined in claim 3, wherein a portion of the first set of programmable logic regions is programmed with custom user logic in the second configuration.

5. The integrated circuit defined in claim 2, wherein the storage circuitry comprises non-volatile memory.

6. The integrated circuit defined in claim 5, wherein the non-volatile memory comprises flash memory.

7. The integrated circuit defined in claim 6 further comprising:
   a first configuration image stored on the flash memory that defines the first configuration of the integrated circuit; and
   a second configuration image stored on the flash memory that defines the second configuration of the integrated circuit.

8. The integrated circuit defined in claim 1 wherein the memory interface circuitry comprises:
   read enable control circuitry that generates a read enable control signal based at least partly on the loaded calibration data.

9. The integrated circuit defined in claim 8 wherein the memory interface circuitry further comprises:
   strobe signal generation circuitry that generates a strobe signal based at least partly on the loaded calibration data.

10. The integrated circuit defined in claim 9 wherein the memory interface circuitry further comprises:
    data capture circuitry that receives data from the external memory and that captures the received data based on the read enable control signal and the strobe signal.

11. The integrated circuit defined in claim 1 wherein the integrated circuit loads the first configuration during an initial boot-up and wherein the integrated circuit loads the second configuration for subsequent boot-ups after the initial boot-up.

12. The integrated circuit defined in claim 11 wherein the integrated circuit determines whether the calibration data should be reset and, in response to determining that the calibration data should be reset, reboots and loads the first configuration.

13. A method of interfacing between an integrated circuit and memory, wherein the integrated circuit comprises a memory interface and storage circuitry, the method comprising:
    with the integrated circuit, retrieving a first configuration image from the storage circuitry;
    loading the first configuration image to configure the integrated circuit to generate calibration data;
    saving the calibration data at the storage circuitry;
    with the integrated circuit, retrieving a second configuration image from the storage circuitry; and
    replacing the first configuration image by loading the second configuration image to configure the integrated circuit to load the calibration data and to operate the memory interface based on the calibration data.

14. The method defined in claim 13, wherein the storage circuitry comprises non-volatile memory, the method further comprising:
    while the integrated circuit is loaded with the first configuration image, storing the calibration data on the non-volatile memory.

15. The method defined in claim 14, further comprising:
    with the memory interface, receiving data from the memory; and
    with the memory interface, synchronizing a strobe signal with the received data based on the calibration data.

16. The method defined in claim 13, wherein the integrated circuit comprises a programmable integrated circuit having a plurality of programmable regions, the method further comprising:
    loading the first configuration image onto the plurality of programmable regions; and
    loading the second configuration image onto the plurality of programmable regions.

17. The method defined in claim 13, further comprising:
    with the memory interface, writing test data to the memory while the first configuration image is loaded;
    with the memory interface, reading the test data from the memory; and
    with the memory interface, determining whether the test data read from the memory includes any errors.

18. The method defined in claim 17, further comprising:
    in response to determining that the test data read from the memory does not include any errors, storing read enable signal settings as a part of the calibration data.

19. The method defined in claim 13, further comprising:
    with the memory interface, generating a read enable control signal based on the calibration data while the second configuration image is loaded; and
    with the memory interface, capturing data from the memory using the read enable control signal.

20. The method defined in claim 13, further comprising:
    with the memory interface, generating a strobe signal having a selected strobe signal phase identified by the calibration data while the second configuration image is loaded; and
    with the memory interface, capturing data from the memory using the strobe signal.

21. A method of using memory interface calibration circuitry for a memory interface on an integrated circuit that communicates with memory, the method comprising:
    configuring a set of programmable logic regions to perform calibration operations;
    subsequent to completion of the calibration operations, configuring a portion of the set of programmable logic regions to implement custom user functions.

22. The method defined in claim 21 wherein configuring the set of programmable logic regions to perform calibration operations comprises loading a first configuration image from storage circuitry that configures the set of programmable logic regions to generate calibration data.

23. The method defined in claim 22, further comprising:
    loading a second configuration image from the storage circuitry that configures the integrated circuit to load the calibration data and operate the memory interface based on the calibration data, wherein the second configuration image configures the portion of the set of programmable logic regions to implement the custom user functions.

* * * * *